United States Patent [19]

Cheung

[11] Patent Number: 4,593,456
[45] Date of Patent: Jun. 10, 1986

[54] PYROELECTRIC THERMAL DETECTOR ARRAY

[75] Inventor: Derek T. Cheung, Thousand Oaks, Calif.

[73] Assignee: Rockwell International Corporation, El Segundo, Calif.

[21] Appl. No.: 721,750

[22] Filed: Apr. 10, 1985

Related U.S. Application Data

[62] Division of Ser. No. 487,659, Apr. 25, 1983, Pat. No. 4,532,424.

[51] Int. Cl.[4] .................. H01L 35/34; H01L 37/00; G01J 5/10
[52] U.S. Cl. ........................... 29/573; 29/589; 29/580; 148/1.5; 148/DIG. 135; 357/55; 136/201; 250/338; 250/332; 250/349
[58] Field of Search ................ 29/573, 589, 591, 580; 136/201, 203, 223, 230; 357/55; 250/332, 333, 338, 349; 148/1.5, DIG. 135

[56] References Cited

U.S. PATENT DOCUMENTS

| | | | |
|---|---|---|---|
| 3,581,092 | 5/1971 | Pearsall | 250/349 |
| 3,842,276 | 10/1974 | Southgate | 250/338 |
| 3,932,753 | 1/1976 | Stotlar | 250/338 |
| 3,985,685 | 10/1976 | Houlton et al. | 250/338 |
| 4,009,516 | 3/1977 | Chiang et al. | 250/338 |
| 4,053,806 | 10/1977 | Turnbull et al. | 313/388 |
| 4,060,729 | 11/1977 | Byer et al. | 250/338 |
| 4,072,863 | 2/1978 | Roundy | 250/332 |
| 4,139,444 | 2/1979 | Singer et al. | 313/388 |
| 4,162,402 | 7/1979 | Hopper | 250/332 |
| 4,214,165 | 7/1980 | Asawa | 250/338 |
| 4,218,620 | 8/1980 | Oettel | 250/338 |
| 4,317,063 | 2/1982 | Pedder et al. | 313/388 |
| 4,341,012 | 7/1982 | Fripp et al. | 250/332 |
| 4,343,960 | 8/1982 | Eguchi et al. | 136/225 |
| 4,354,109 | 10/1982 | Gelpey et al. | 250/349 |
| 4,465,894 | 8/1984 | Reyes | 136/225 |
| 4,468,854 | 9/1984 | Chou et al. | 29/573 |
| 4,493,939 | 1/1985 | Blaske et al. | 136/212 |

FOREIGN PATENT DOCUMENTS

| | | | |
|---|---|---|---|
| 0069527 | 6/1981 | Japan | 250/338 |
| 0066828 | 4/1983 | Japan | 250/338 |

*Primary Examiner*—Brian E. Hearn
*Assistant Examiner*—David A. Hey
*Attorney, Agent, or Firm*—H. Fredrick Hamann; Craig O. Malin; John J. Deinken

[57] ABSTRACT

A thermal detector array includes a substrate layer with a pyroelectric layer attached to the substrate, a plurality of detector regions being defined in the pyroelectric layer by openings through the layer. An array of cavities in the substrate surface separates the detector regions from the surface. First and second electrodes are placed on opposite sides of each detector region or on a single side in a coplanar embodiment. The array is joined to a signal processing device by means of corresponding metallic contacts on the pyroelectric layer and the processing device.

7 Claims, 14 Drawing Figures

PYROELECTRIC THERMAL DETECTOR ARRAY

CROSS REFERENCE TO RELATED APPLICATIONS

This is a division of application Ser. No. 487,659, filed Apr. 25, 1983 now U.S. Pat. No. 4,532,424.

BACKGROUND OF THE INVENTION

This invention relates to pyroelectric detector arrays for sensing electromagnetic radiation.

Radiation detectors can generally be divided into two broad categories, according to the nature of the energy detected. Quantum or phonton detectors respond to discrete excitations caused by the action of individual photons. Thermal detectors are sensitive to changes in the temperature of the detector material caused by the absorption of energy from the incoming radiation. This absorption of the radiant energy may be direct, by adsorption within the detector material itself, or indirect through absorption in some auxiliary structure which conducts the heat to the detector material.

Among the various types of thermal detectors, pyroelectric detectors utilize the spontaneous electrical polarization of a pyroelectric material, which results from the anharmonic ionic vibrations possible in these classes of crystals which lack a center of symmetry. When the temperature of a pyroelectric detector is changed, the temperature change alters the spontaneous polarization of the material which, in turn, causes a charge to flow. The charge can then be measured and related to the intensity of the incoming radiation.

Pyroelectric detectors may be incorporated into a focal plane array, where the scene to be viewed is optically focussed on a two dimensional matrix of detector elements so that each detector images a particular portion of the scene. The use of focal planes has become particularly desirable in the field of infrared imaging with the advent of improved signal processing techniques and photolithographic processes which allow the fabrication of high density infrared systems employing a large number of detectors per unit area.

Although focal plane research has in the past concentrated on photovoltaic detector designs, the need for cryogenic cooling for such detectors has led to the consideration of thermal detectors for use in medium performance applications. Thermal detectors do not require cooling and, as a consequence, are inherently simpler in design than photovoltaic detectors. In addition, thermal detectors are uniformly sensitive over a wide range of the infrared spectrum and exhibit a nearly constant signal to noise ratio over a large frequency range.

Ideally, a pyroelectric detector would be totally isolated from its surroundings so that thermal losses from the detector would occur only by radiation. In practice, however, some sort of mounting to a substrate is required, and heat diffusion into the substrate degrades the responsivity of the detector. Thus, one desirable feature of a pyroelectric detector design is to provide a detector mounting scheme which minimizes heat transfer between the detector and the mounting structure.

Another goal in pyroelectric detector design is to minimize the mass of the pyroelectric material, because a smaller thermal mass will change temperature in response to absorbed radiation more quickly and with a higher responsivity than a larger mass, leading to a faster and more sensitive detector.

Minimizing the detector mass usually involves thinning the detector material, but this approach conflicts with the need for maximum thermal isolation, since a minimal amount of support is desirable for reduced heat transfer, but thinner layers of pyroelectric material are more fragile and therefore require more substantial support structures. Consequently, the introduction of a pyroelectric detector array design exhibiting increased thermal isolation for a relatively thin detector without sacrificing the physical integrity of the detector structure would be an important contribution to the art in the thermal imaging field.

SUMMARY OF THE INVENTION

It is a general objective of this invention to provide an improved pyroelectric detector array.

In one embodiment, the array of this invention includes a substrate layer with a pyroelectric layer disposed on a surface of the substrate and a plurality of detector regions defined in the pyroelectric layer by a plurality of openings through the layer. A plurality of cavities in the substrate surface separate the detector regions from the surface.

Electrodes may be added in a transverse arrangement, with a first electrode on a first side of each detector region adjacent the substrate surface and a second electrode on a second side of each detector region. Coplanar electrodes may also be used, with first and second electrodes disposed on a first side of each detector region.

The pyroelectric layer may be made of a ferroelectric crystal or of a pyroelectric organic polymer. The substrate may be fabricated from silicon.

The array may be mated with a semiconductor signal processing device, with an electrically conductive contact associated with each of the second electrodes to couple the detector outputs to the signal processing device and space the device from the detector regions.

This invention also provides a method of making a thermal detector array, which begins with a layer of pyroelectric material and a support layer. A first surface of the pyroelectric layer is affixed to the support layer and a plurality of openings is established through the pyroelectric layer to define each detector region in the layer. A substrate is then affixed to a second surface of the pyroelectric layer and the support layer is removed from the pyroelectric layer.

In more particular embodiments, the pyroelectric layer is thinned after it is attached to the support layer and a plurality of cavities are established in the surface of the substrate so that each cavity separates one of the detector regions from the surface of the substrate.

The method may further include depositing transverse or coplanar first and second arrays of electrodes on the pyroelectric layer, and a semiconductor signal processing device may be attached to the pyroelectric layer by means of an array of electrically conductive contacts.

DESCRIPTION OF THE DRAWINGS

Additional objectives, features, and advantages of the invention are presented below under the heading entitled Description of the Invention, which refers to the drawings, where.

DESCRIPTION OF THE INVENTION

This invention provides a significant new technique for providing a thermal detector array with increased thermal isolation and reduced detector mass.

Figure 1:
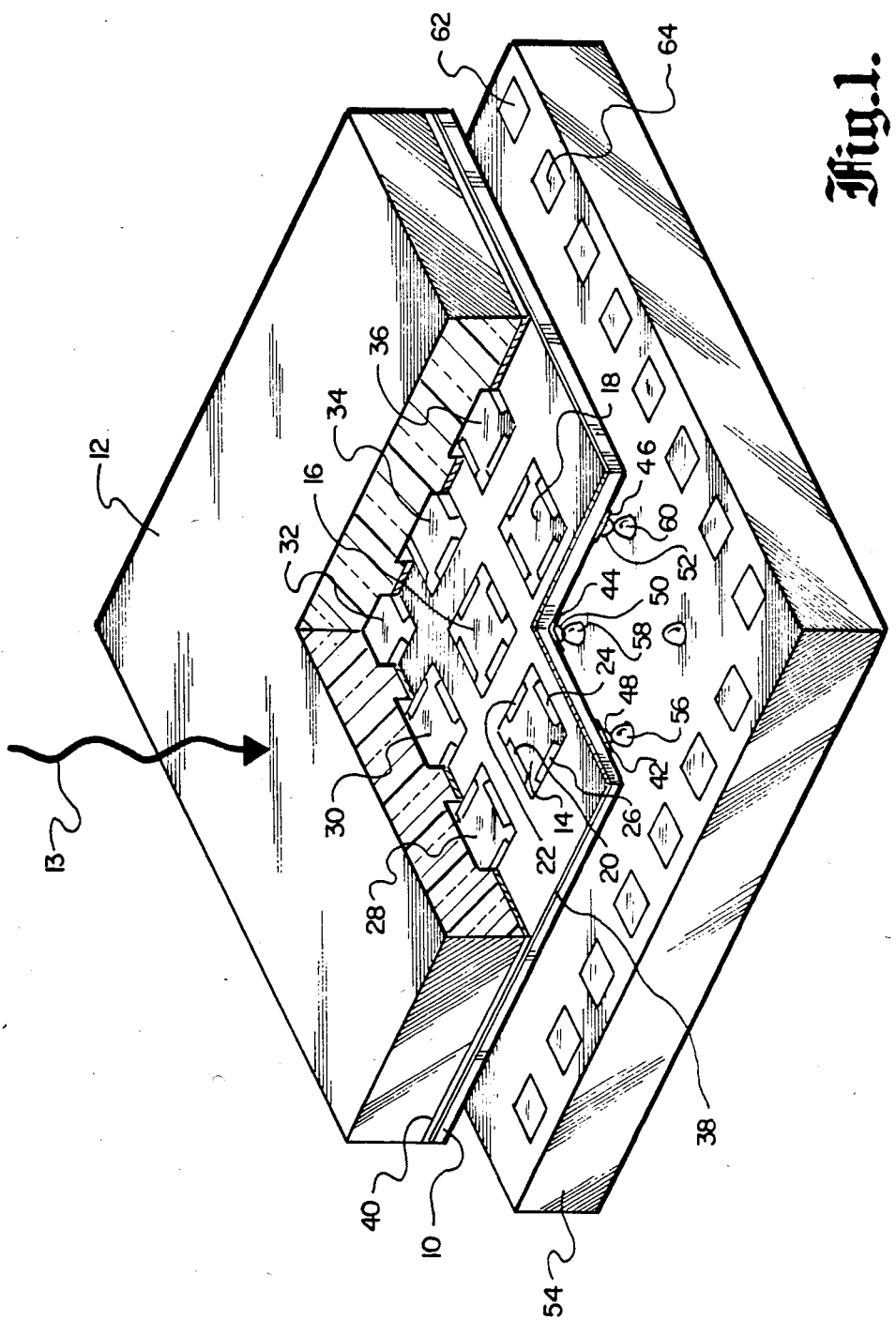
FIG. 1 is a perspective, partially cutaway view of a pyroelectric detector array constructed according to the present invention.

A preferred embodiment of the thermal detector array of this invention is illustrated in a perspective, partially cutaway view in FIG. 1. The thermally sensitive element of the device is a thin pyroelectric layer 10, which is secured to a supporting substrate layer 12. The substrate 12 is transparent so that incoming thermal radiation, as represented by the photon 13, can reach the pyroelectric layer 10. An array of detector regions, including, for example, the regions 14, 16, and 18, is fabricated in the pyroelectric layer. Each of these regions is defined by a number of openings which extend through the pyroelectric layer and surround the defined detector region. The detector region 14, for example, is defined by four rectangular slots 20, 22, 24, and 26.

An array of cavities, such as the cavities 28, 30, 32, 34, and 36, which are exposed in FIG. 1 by the partial cutaway of the substrate 12, is formed in the lower surface of the substrate such that each cavity separates one of the detector regions from the substrate, thereby providing thermal isolation for the detector regions.

A common ground electrode 38 is deposited over the upper surface of the pyroelectric layer 10. This electrode layer may consist, for example, of indium metal which is deposited in a thin layer over the detector regions and in a thicker layer over the areas outside of the detector regions. This configuration helps to preserve the thermal isolation of the pyroelectric detector regions. The electrode layer is also blackened over the detector regions to increase the thermal absorption of these regions.

A corresponding indium ground electrode layer 40 is deposited on the lower surface of the substrate layer 12. In fabricating this device, these two electrode layers are joined together with sufficient heat and pressure to form a diffusion bond, thereby securing the pyroelectric layer 10 to the substrate layer 12.

A second electrode is deposited over the lower surface of each detector region. Electrodes 42, 44, and 46, for example, which are partially visible in FIG. 1, correspond to the detector regions 14, 16, and 18. Each such electrode extends to one side of its corresponding detector region and is there connected to a relatively thick metallic contact. The contacts 48, 50, and 52, for example, are deposited on the electrodes 42, 44, and 46, respectively.

The contacts associated with the array of second electrodes on the lower surface of the pyroelectric layer provide the means by which the detector array may be connected to a semiconductor signal processing device 54. An array of interconnecting contacts on the processing device, including the contacts 56, 58, and 60, is aligned with the contacts on the pyroelectric layer. The pyroelectric layer and the signal processing device are joined by means of these corresponding contacts. The detector regions are thereby electrically connected to but thermally isolated from the signal processing device 54. Bonding pads, such as the pads 62 and 64, are provided on the signal processing device for making additional electrical connections to external circuitry. An electrical connection is also provided between the common ground electrode 38 and the processing device 54. This may be accomplished in a number of ways familiar to those skilled in the art. A relatively thick metallic contact, for example, might be formed on the processing device 54 to extend upward through an opening in the pyroelectric layer 10 and contact the ground electrode 40 on the substrate 12.

A number of different input circuits and multiplexing techniques might be incorporated into the signal processing device to convert the output of the pyroelectric array into useful data for analysis or visual display. Since a variety of suitable techniques are well known to those skilled in the art, however, there is no need to present them here in any further detail.

A technique for making a detector array similar to that shown in FIG. 1 is illustrated in FIGS. 2–13. The method begins with a layer of pyroelectric material 10, which is shown in plan view in FIG. 2 and in a cross-sectional view (along the line 3—3 of FIG. 2) in FIG. 3. An array of electrodes, such as the electrodes 66, 68, and 70, is deposited on the pyroelectric layer. The pyroelectric material can be a ferroelectric crystal, such as strontium barium niobate, triglycine sulfate, lead lanthanum zirconate titanate, etc., or a pyroelectric organic polymer, such as polyvinylidene fluoride or polyacrylonitrile.

Figure 4:
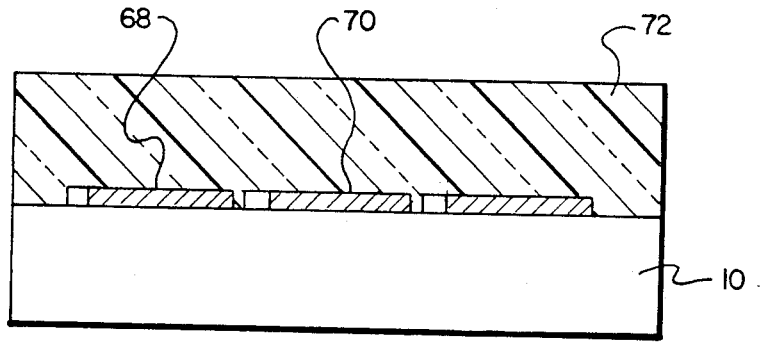
Figure 5:
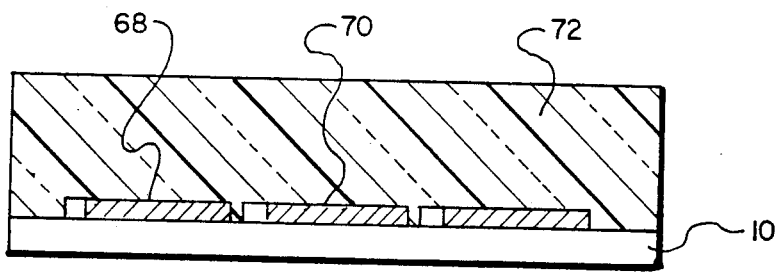

Next, photoresist is used to mount the pyroelectric layer 10 on a silicon support layer 72, as shown in the cross sectional view of FIG. 4. The pyroelectric layer is then polished to reduce its thickness to approximately 10 $\mu$m and subsequently ion milled until a thickness of approximately 2–5 $\mu$m is achieved, as shown in FIG. 5. This technique of providing a temporary support for the pyroelectric layer allows the pyroelectric layer to be substantially reduced in thickness as compared to prior designs, permitting significant gains in the performance of the resulting detectors.

Figure 2:
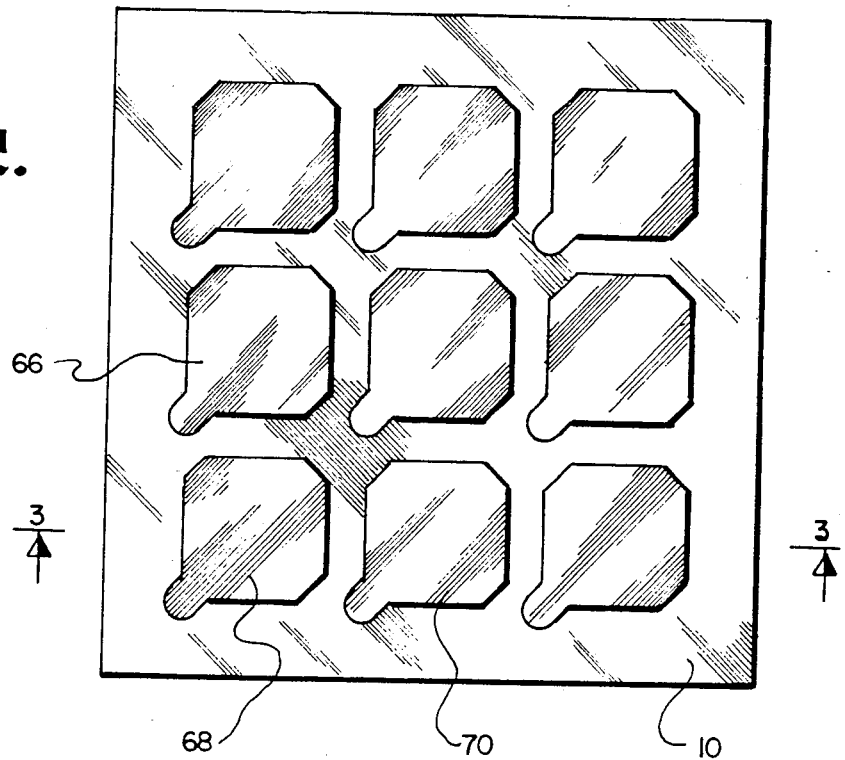
FIGS. 2, 6, 8, and 10 are plan views
Figure 3:
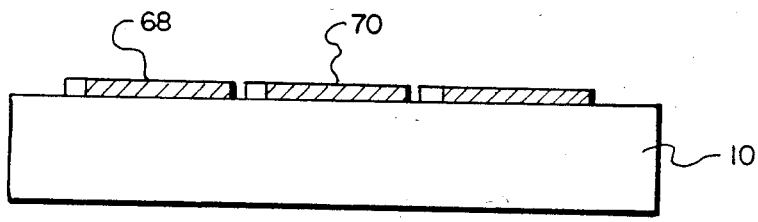
FIGS. 3–5, 7, 9, and 11–13 are cross-sectional side views illustrating various steps in the process of manufacturing a pyroelectric detector array according to the present invention.
Figure 6:
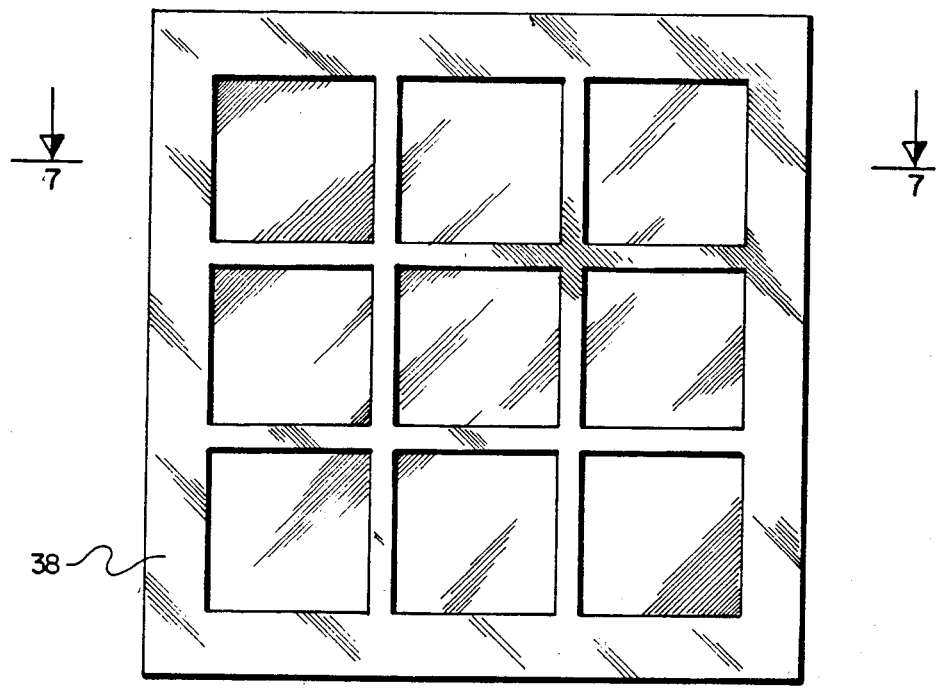
Figure 7:
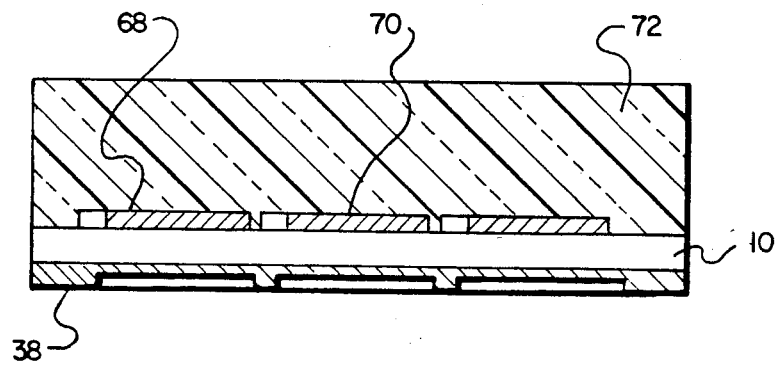

As shown in FIGS. 6 and 7, (FIG. 6 is a plan view of the second surface of the pyroelectric layer seen from a direction opposite to that of FIG. 2 and FIG. 7 is a cross-sectional view along the line 7—7 of FIG. 6) ground electrode 38 is then deposited on a second surface of the pyroelectric layer 10. The ground electrode substantially covers the surface of the silicon support layer 72, but is reduced to minimal thickness where it overlays the areas which will become detector regions, in order to maximize the thermal isolation of the detector regions. This ground electrode typically is formed by an indium metal deposition.

Figure 8:
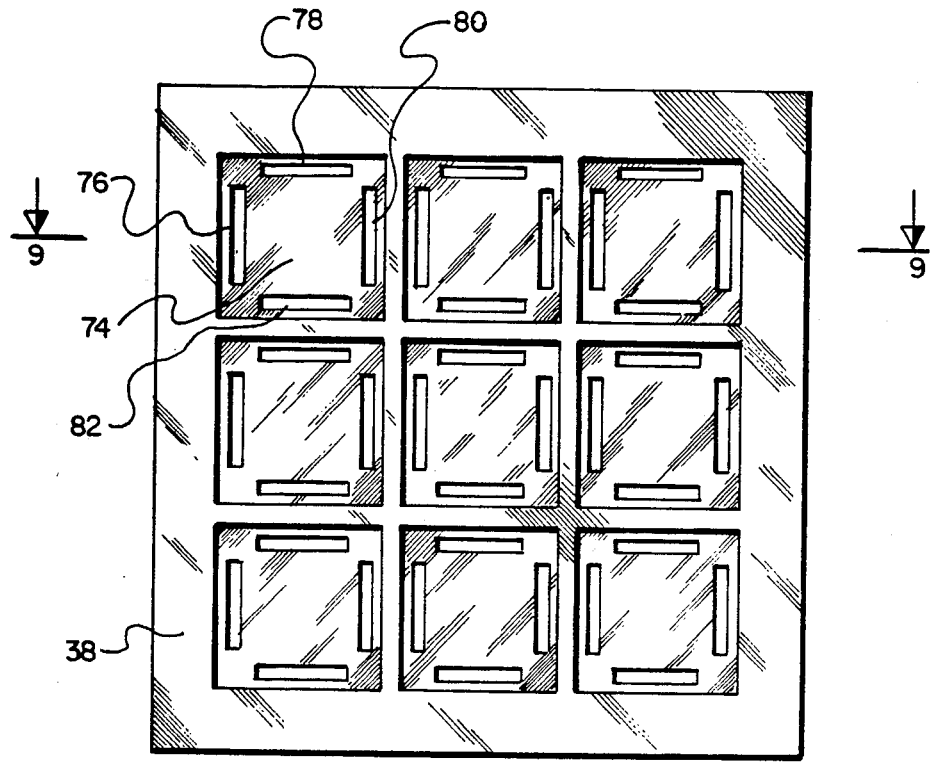
Figure 9:
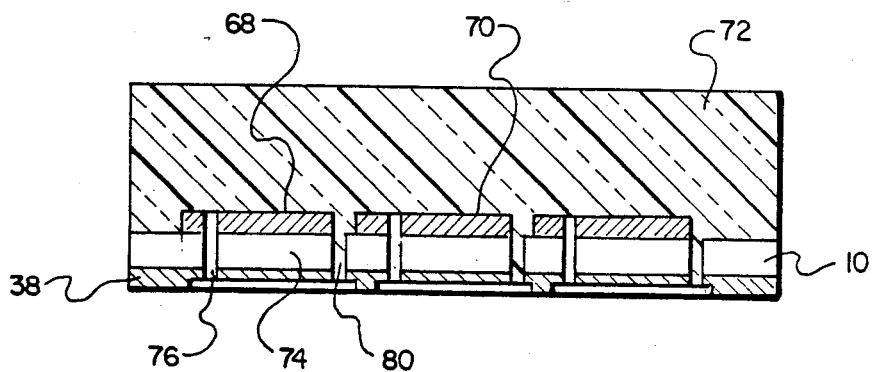

FIG. 8 is a plan view which is taken from the same direction as FIG. 6, with FIG. 9 a cross-sectional view along the line 9—9 of FIG. 8. As shown by these drawings, a series of openings are established through the pyroelectric layer 10 to define each detector region in the layer. Thus the detector region 74 is defined by four slots 76, 78, 80, and 82. Ion milling may be used to form these slots through the pyroelectric layer 10. A plurality of openings are established to define an array of detector regions in the pyroelectric layer.

Figure 10:
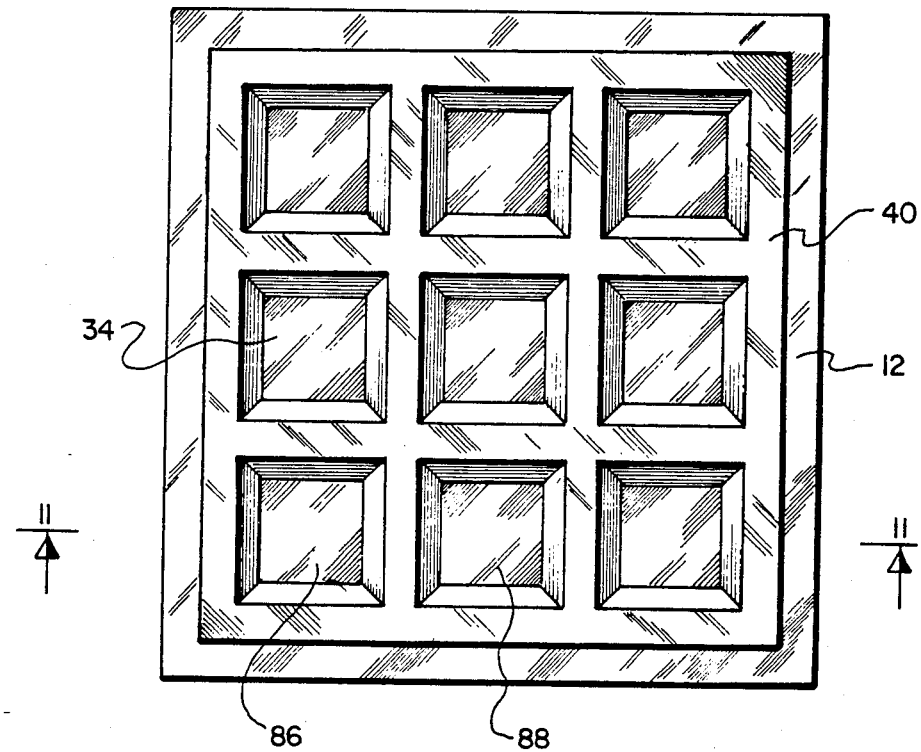
Figure 11:
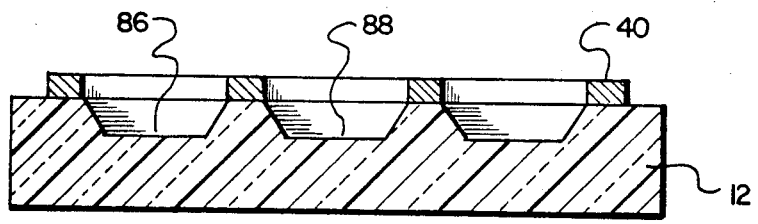

FIG. 10 is a plan view and FIG. 11 a cross sectional view (along the line 11—11 of FIG. 10) of a silicon substrate 12. A common ground 40 is deposited, typically using indium, on the substrate 12 and a plurality of cavities, such as the cavities 84, 86, and 88, are then etched into the surface of the substrate.

Figure 12:
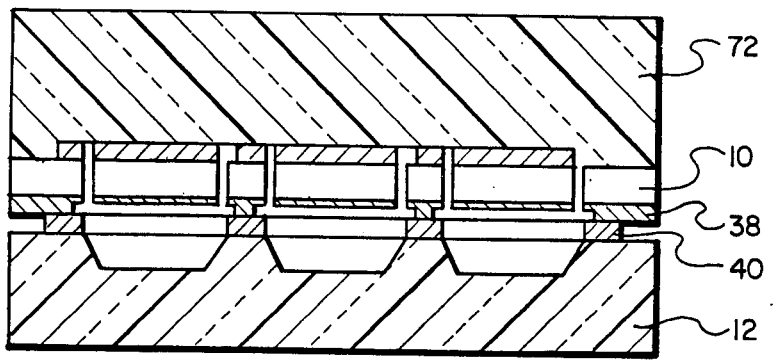

FIG. 12 is a cross-sectional view from the same direction as that of FIG. 11. As shown in FIG. 12, the support layer 72 is aligned with the pyroelectric layer so that each cavity separates one of the detector regions from the surface of the substrate. The electrode layers 38 and 40 are then joined together by using sufficient heat and pressure to form a diffusion bond. In this manner, the substrate 12 provides structural support for the relatively fragile pyroelectric layer 10 while maintaining thermal isolation for the detector regions. The structure may then be treated with a photoresist solvent to dissolve the bond between the pyroelectric layer and the silicon support layer 72, allowing the support layer to be removed.

Figure 13:
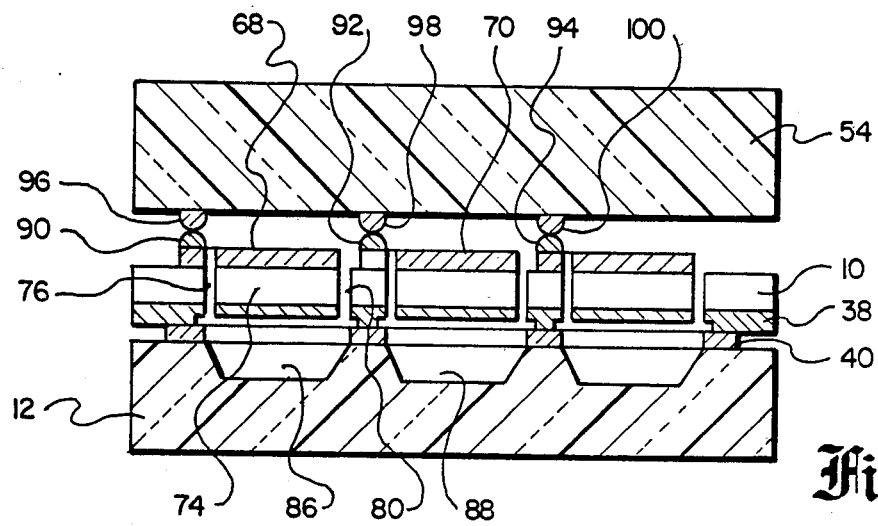

Next, as shown in the cross-sectional view of FIG. 13, an interconnect technique, such as that disclosed in Tracy, U.S. Pat. No. 4,067,104, is employed to join a silicon-based semiconductor processing circuit 54 to the pyroelectric layer 10. An array of contacts, such as the contacts 90, 92, and 94, is deposited on the pyroelectric layer 10, each contact being formed on one of the electrodes thereon. A corresponding array of contacts, such as the contacts 96, 98, and 100, is deposited on the processing circuit 54. The contact arrays are then bonded together, providing electrical connections between the detector regions and the processing circuitry while maintaining the thermal isolation of the detector regions.

Figure 14:
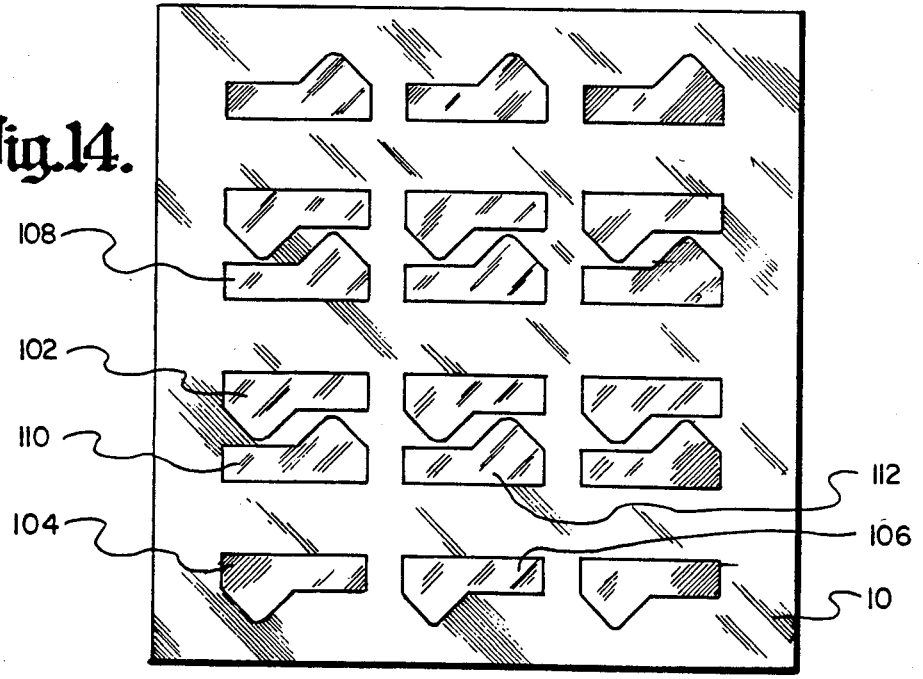
FIG. 14 is a plan view analogous to FIG. 2 and showing a coplanar electrode embodiment of a pyroelectric detector array.

Those skilled in the art will appreciate that a number of modifications to the array design of FIG. 1 might be made. FIG. 14, for example, is a plan view analogous to FIG. 2 showing the electrode pattern for a pyroelectric detector array incorporating coplanar electrodes. In this embodiment, a first array of electrodes, such as the electrodes 102, 104, 106, and a second array of electrodes, such as the electrodes 108, 110, and 112, are deposited on the signal processing device side of the pyroelectric layer 10. One electrode in each array is in electrical contact with each detector region, so that the detectors operate as longitudinal detectors. Metallic contacts are deposited on each electrode in each array, so that both arrays can be connected directly to a signal processing device in the manner described above. Such a coplanar design for pyroelectric devices is disclosed, for example, in Stotlar, U.S. Pat. No. 3,932,753.

Another possible modification would incorporate optical gain into the device, such as by shaping the outer surface of the substrate into a lens pattern to focus incoming thermal radiation on the detector regions. Furthermore, additional gains in performance might be achieved with particular orientations of the pyroelectric material, or by using composite pyroelectric materials.

Because of the ability to operate at ambient temperature, pyroelectric arrays are inherently simple, with cooling, cold-shielding, and background suppression requirements eliminated. Furthermore, the improved focal plane array design of the present invention will allow higher performance and is readily adaptable to low cost production methods.

Although some typical embodiments of the present invention have been illustrated and discussed above, modifications and alternative forms of the invention will undoubtedly be apparent to those skilled in the art. Various changes, for example, could be made in the configurations, sizes, and arrangements of the components without departing from the scope of the invention. Those skilled in the art will appreciate that certain dimensions in the drawings are exaggerated relative to other dimensions in order to promote the clarity of the illustration. Furthermore, equivalent elements may be substituted. Consequently, the examples presented herein should be considered illustrative rather than comprehensive, the appended claims being more indicative of the full scope of the invention.

I claim:

1. A method of making a thermal detector array, comprising the steps of:
   providing a layer of pyroelectric material;
   providing a support layer;
   affixing first surface of the pyroelectric layer to the support layer;
   establishing a plurality of openings through the pyroelectric layer to define a detector region in the layer;
   repeating a plurality of times the step of establishing a plurality of openings to define a plurality of detector regions in the pyroelectric layer;
   providing a substrate;
   affixing a first surface of the substrate to a second surface of the pyroelectric layer; and
   removing the support layer.

2. The method of claim 1, further comprising, prior to the step of establishing plurality of openings, the step of thinning the pyroelectric layer.

3. The method of claim 1, further comprising, prior to the step of affixing the substrate to the pyroelectric layer, the step of establishing a plurality of cavities in the first surface of the substrate, the first surface then being affixed so that each cavity separates one of the detector regions from the surface of the substrate.

4. The method of claim 1, further comprising, prior to the step of providing a support layer, the step of:
   depositing a first array of electrodes on the first surface of the pyroelectric layer; and
   further comprising, prior to the step of establishing a plurality of openings, the step of:
   depositing a second array of electrodes on the second surface of the pyroelectric layer,
   whereby a first side of each detector region contacts the first array and a second side of each detector region contacts the second array.

5. The method of claim 1, further comprising, prior to the step of providing a support layer, the step of:
   depositing a first array of electrodes on the first surface of the pyroelectric layer and
   depositing a second array of electrodes on the first surface of the pyroelectric layer,
   whereby a first side of each detector region contacts both the first and second arrays.

6. The method of making a thermal detector array, comprising the steps of:
   providing a layer of pyroelectric material;
   depositing a first array of electrodes on a first surface of the pyroelectric layer;
   providing a support layer;
   affixing the support layer to the first surface of the pyroelectric layer;
   thinning the pyroelectric layer;

depositing a second array of electrodes on a second surface of the pyroelectric layer;

establishing a plurality of openings through the pyroelectric layer to define a detector region in the layer, with one of the first array electrodes contacting a first side of the detector region and one of the second array electrodes contacting a second side of the detector region;

repeating the step of establishing openings to define a plurality of detector regions in the pyroelectric layer;

providing a substrate;

establishing a plurality of cavities in a first surface of the substrate;

affixing the first surface of the substrate to the second surface of the pyroelectric layer so that each cavity separates one of the detector regions from the surface of the substrate; and removing the support layer.

7. The method of claim 6, further comprising the steps of:

depositing an electrically conductive contact on each of the second electrodes;

providing a semiconductor signal processing device; and affixing the signal processing device to the pyroelectric layer with the contacts coupling the second electrode array to the signal processing device and spacing the device from the detector regions.

* * * * *